United States Patent [19]

Sundeen et al.

[11] Patent Number: 5,497,093
[45] Date of Patent: Mar. 5, 1996

[54] METHOD AND APPARATUS FOR DIAGNOSING A TWIN-COIL, BI-STABLE, MAGNETICALLY LATCHED SOLENOID

[75] Inventors: Arthur R. Sundeen, Lansing; James C. Byrne, Farmington Hill; Vincent A. Cichosz, Eastpointe, all of Mich.

[73] Assignee: General Motors Corporation, Detroit, Mich.

[21] Appl. No.: 236,053

[22] Filed: May 2, 1994

[51] Int. Cl.⁶ .................. G01R 31/02; G01R 31/327; G08B 21/00
[52] U.S. Cl. ............................. 324/415; 340/644
[58] Field of Search .................. 324/415, 418, 324/424, 537, 546; 340/644; 361/160, 170

[56] References Cited

U.S. PATENT DOCUMENTS 5,287,087  2/1994  Jencks et al. .................. 340/664

Primary Examiner—Walter E. Snow
Attorney, Agent, or Firm—Vincent A. Cichosz

[57] ABSTRACT

Electrical and mechanical operation of a bistable magnetically latching solenoid is diagnosed by monitoring induced voltage across the one of a pair of solenoid coils not energized. Energization of one of the pair of coils induces voltage across the other of the coils not energized and plunger actuation in response to energization induces another voltage therethrough. The various induced voltages are distinguishable as between those caused by energization of a coil or motion of the plunger.

6 Claims, 4 Drawing Sheets

| CYL POSITION \ CONTACTS | IGN0 | IGN1 | IGN2 |
|---|---|---|---|
| OFF/LOCK | 0 | 0 | 0 |
| ACC | 1 | 0 | 1 |
| RUN | 1 | 1 | 1 |
| CRANK | 1 | 1 | 1 |
FIG. 2
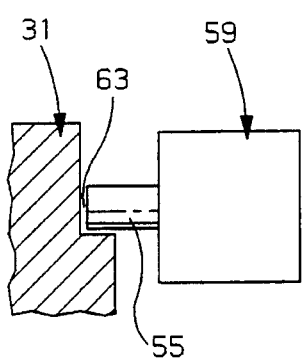 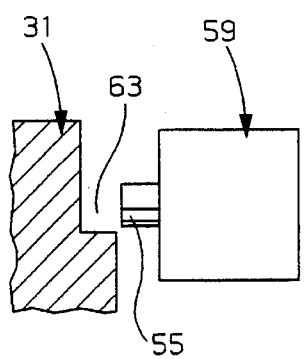 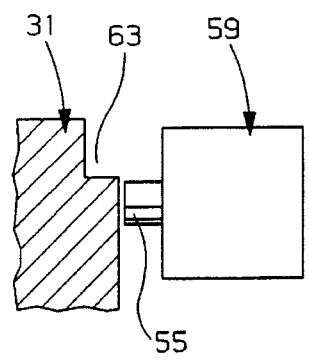
FIG. 3A   FIG. 3B   FIG. 3C

METHOD AND APPARATUS FOR DIAGNOSING A TWIN-COIL, BI-STABLE, MAGNETICALLY LATCHED SOLENOID

BACKGROUND OF THE INVENTION

This invention relates to diagnosis of electrical and mechanical faults in a bi-stable magnetically latching solenoid.

Mechanically actuated switches have been utilized to detect solenoid plunger motion through mechanical coupling thereto. These have proven to be somewhat unreliable due to various mechanical failure modes and tolerance stack. Additionally, mechanical detection adds expense, piece count and packaging requirements to any system utilizing such a solenoid actuation detector.

Additionally, non-actuation of a solenoid plunger may be due to electrical or mechanical faults. Mechanically actuated switches are incapable of diagnosis beyond simplistic traditional go/no go applications and cannot be used to distinguish between mechanical and electrical faults.

Therefore, it is desirable to provide for solenoid diagnosis of electrical and mechanical faults without the additional burdens and shortcomings of mechanical systems.

SUMMARY OF THE INVENTION

The present invention is implemented in an ignition lock cylinder and gear shift lever interlock system for a motor vehicle having an ignition lock cylinder with an OFF/LOCK position, RUN position and an intermediate position therebetween such as commonly used for accessory powering. The interlock system is equally applicable to automatic or manual transmission equipped vehicles. The gear shift lever of a vehicle has a predetermined park position (park for automatic transmission and preferably reverse for manual transmission). The vehicle's ignition lock cylinder and gear shift lever are caused to interlock in such a way as to inhibit rotation of the ignition lock cylinder in into the OFF/LOCK position until it is verified that the gear shift lever has been inhibited from moving out of the park position. Further, the gear shift lever is inhibited from moving out of the park position until it has been verified that the ignition lock cylinder has been inhibited from moving into the OFF/LOCK position.

The system includes two bi-stable magnetically latching solenoid, one associated with each of the ignition lock cylinder and gear shift lever. The solenoid associated with the ignition lock cylinder is effective in two states, one to inhibit the lock cylinder from entering the lock position and the other to enable the lock cylinder to enter the lock position. The solenoid associated with the gear shift lever is likewise effective in two states, one to inhibit the gear shift lever from exiting the park position and the other to enable the gear shift lever to exit the park position.

According to one aspect of the present invention, the solenoid coil not being energized is monitored to detect actuation of the plunger due to energization of the other coil. Motion of the plunger will induce a voltage upon the coil not energized and when detected indicates actuation of the plunger. According to another aspect of the invention, the coil not being energized is monitored to detect an electrical fault in the energization circuitry. The change in current through the energized coil causes an induced voltage upon the coil not energized and when not detected indicates a fault in the energization circuitry. According to yet another aspect of the present invention, actuation response time of the plunger may indicate degradation in performance of the solenoid.

BRIEF DESCRIPTION OF THE DRAWINGS

FIG. 2 shows a state chart for various ignition switch contacts at various ignition lock cylinder positions.

FIGS. 3A–3C are graphical representation of the various ignition lock cylinder and corresponding solenoid states.

DETAILED DESCRIPTION OF THE DRAWINGS

Figure 1:
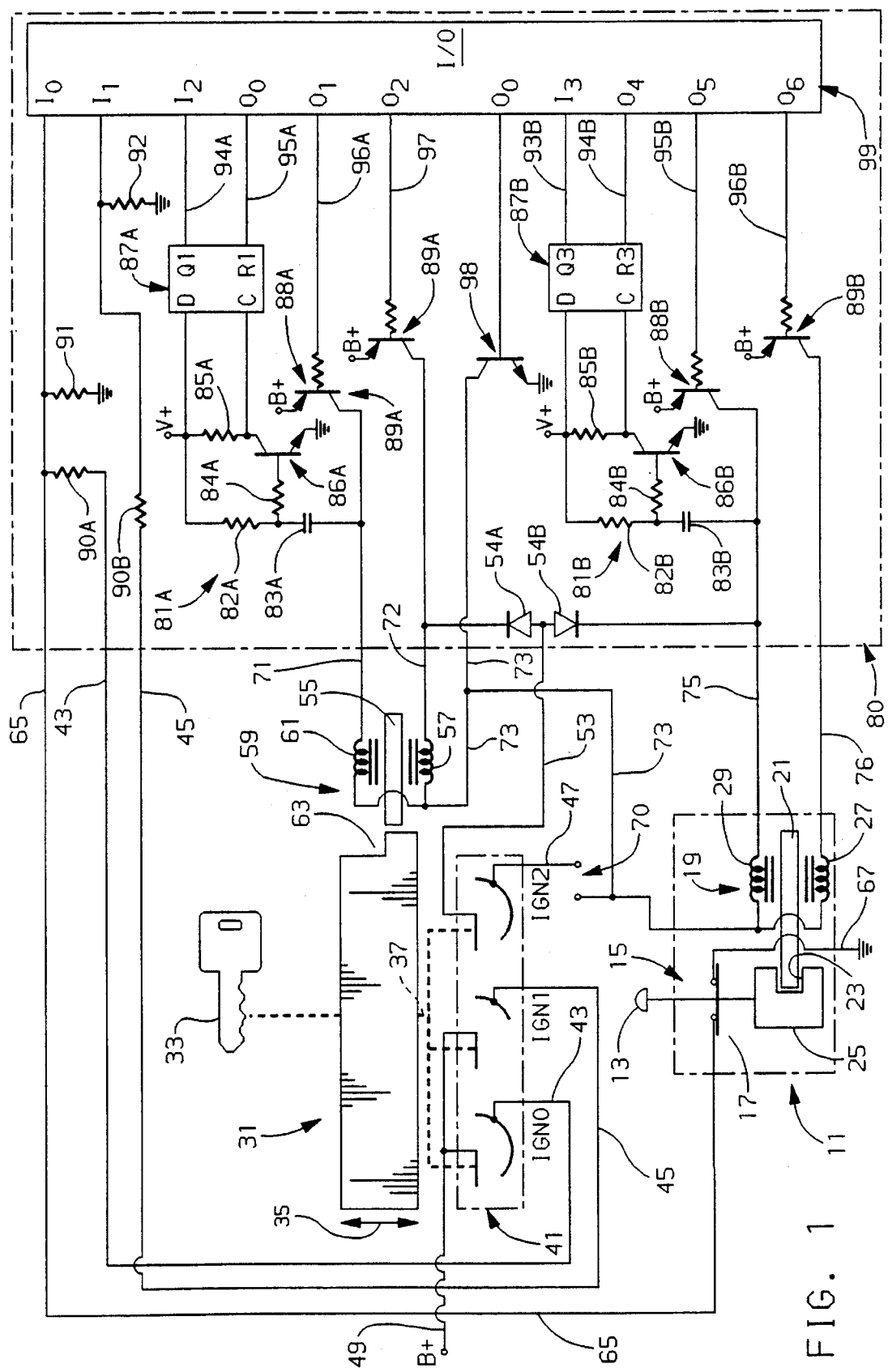
FIG. 1 is a system diagram of an ignition lock cylinder and gear shift lever interlock system for an automatic or manual transmission or transaxle equipped motor vehicle implementing the method and a preferred embodiment of the apparatus of the present invention.

Referring first to FIG. 1, an ignition lock cylinder and gear shift lever interlock system is illustrated. The figure is representative of a system incorporating the method and apparatus of the present invention. The interlock system is applicable to motor vehicles equipped with a gear shift lever for either an automatic or manual transmission or transaxle (hereinafter automatic or manual). Shifter assembly 11 is functionally illustrated with respect to the shift inhibit functions of the interlock system. Gear shift lever 13 represents, in the case of an automatic, any of a well known variety of mechanical means comprising a button or other mechanical actuator (hereinafter shifter button) necessarily actuated by the vehicle operator in order to move the gear shift lever from the park position to any of the desired other gear positions. In the case of a manual, gear shift lever 13 represents a conventional gear shift lever and does not have any such shifter button associated therewith. Gear shift lever 13 is shown in the park position (park for automatic and reverse for manual). Park switch 15 is shown communicating with gear shift lever such that actuation of the shifter button (automatic) or movement of the gear shift lever out of the park position causes park switch 15 to open by virtue of moving contact 17. Park switch 15 closed contacts couple line 65 to ground reference via line 67. Also shown associated with gear shift lever assembly 11 is a bi-stable magnetically latching solenoid 19 having plunger 21, shift inhibit coil (SIC) 27 and shift enable coil (SEC) 29. Gear shift lever 13 linkage 25 has a shift inhibit pocket 23 for accepting the plunger. Each coil 27,29 when energized is effective to move the plunger in one of two linear directions and the magnetic properties of plunger 21 effectuates latching of the solenoid into the last commanded position. Plunger 19 can travel between a full left position as illustrated or a full right position. The full left position of plunger 19 engages gear shift linkage 25 such that movement of the gear shift lever is inhibited by virtue of inhibiting the shifter button (automatic) or gear shift lever directly (manual).

Ignition lock cylinder 31 is likewise functionally illustrated in FIG. 1. Ignition lock cylinder 31 functions in ways well known to rotate through various positions when key 33 is inserted therein. The conventional rotational motion has been, in the illustration, supplanted by linear motion 35 for clarity of illustration. Insertion and removal of key 33 is possible only when ignition lock cylinder 31 is in an OFF/LOCK position (illustrated), and ignition lock cylinder 31 is operational only when key 33 is properly inserted. Ignition lock cylinder 31 is mechanically linked 37 to ignition switch 41 which is used to make and break circuits in accordance with the position of ignition lock cylinder 31 rotation for cranking the vehicle engine, powering a running engine, powering various vehicle accessories and electrical equipment, and shutting the vehicle down. Ignition switch 41 comprises three sets of contacts labeled IGN0, IGN1 and IGN2 coupled to lines 43, 45 and 47 respectively.

Ignition lock cylinder 31 comprises an OFF/LOCK position whereat ignition switch 41 powers no vehicle functions as illustrated or, at most, may power certain vehicle parasitic loads necessary for various control unit memory keep alive functions, none of which are illustrated. Ignition lock cylinder 31 further comprises an accessory "ACC" position, RUN position and CRANK position, all of which are well known. Ignition switch 41 is functionally illustrated with relation only to the ignition lock cylinder and gear shift lever interlock system.

The state table illustrated in FIG. 2 indicates various switch states for ignition switch contacts IGN0, IGN1 and IGN2 in accordance with ignition lock cylinder 31 position. A zero (0) state represents open contacts and a one (1) state represents closed contacts. From the state table and FIG. 1 schematic illustration of ignition switch 41 it can be seen that line 43 is coupled through IGN0 contacts to vehicle system voltage B+line 49 in ACC, RUN and CRANK, and line 45 is coupled through IGN1 contacts to system voltage B+line 49 in RUN and CRANK. Likewise, it can be seen that override voltage line 47 is coupled through IGN2 contacts to line 53 in ACC, RUN and CRANK. IGN0 and IGN1 contacts are used in relation to normal operation of the system and IGN2 contacts are used to override the system in the event of a run-down battery or other electrical system failure discussed at a later point. Also, relative to the present system, IGN0, IGN1 and IGN2 contact states are identical in both RUN and CRANK positions of the ignition lock cylinder and as such only the RUN position will be discussed herein with the understanding that the CRANK position provides for the same results.

Ignition lock cylinder 31 is further illustrated mechanically communicating with bi-stable magnetically latching solenoid 59 having plunger 55 and lock inhibit coil (LIC) 57 and lock enable coil (LEC) 61. Ignition lock cylinder 31 has a lock inhibit ledge 63 for interference with plunger 55. FIGS. 3A–3C are functionally illustrative of solenoid 59 states in combination with ignition lock cylinder 31 lock inhibit ledge 63. FIG. 3A shows plunger 55 of solenoid 59 in the lock inhibit state whereby ignition lock cylinder 31 is in ACC and inhibited from moving to OFF/LOCK (upward as illustrated) due to interference of plunger 55 with lock inhibit ledge 63. FIG. 3B shows plunger 55 of solenoid 59 in the lock enable state with ignition lock cylinder 31 still in ACC but now free to move to upward to OFF/LOCK without interference between plunger 55 and lock inhibit ledge 63. Finally, FIG. 3C shows plunger 55 of solenoid 59 in the lock enable state with ignition lock cylinder 31 in OFF/LOCK.

Each coil 57,61 when energized is effective to move the plunger in one of two linear directions and the magnetic properties of plunger 55 effectuates latching of the solenoid into the last commanded position. Plunger 55 can travel between a full right position as illustrated or a full left position. The full left position of plunger 55 interferes with ledge 63 such that movement of the ignition lock cylinder into the OFF/LOCK position is inhibited.

Assuming an initial system state as illustrated where gear shift lever 13 is in the park position, then ignition lock cylinder 31 is in OFF/LOCK, solenoid 19 is in the shift inhibit state, solenoid 59 is in the lock enable state and gear shift lever 13 is thereby inhibited from movement out of the park position. However, ignition lock cylinder is free to accept key 33 and rotate to any position. Assuming rotation of ignition lock cylinder 31 to the ACC position, no change in the state of either solenoid 19, 59 occurs and gear shift lever 13 remains inhibited from movement out of the park position while ignition lock cylinder 31 remains rotatable to any available position including OFF/LOCK where the key may be removed.

Assuming rotation of ignition lock cylinder 31 to the RUN position, solenoid 59 is caused to change its state through energization of LIC 57. Plunger 55 moves to the lock inhibit state and is latched in position to impede rotation of ignition lock cylinder beyond ACC to LOCK/OFF. With ignition lock cylinder 31 still in the RUN position, solenoid 19 is next caused to change its state through energization of SEC 29. Plunger 21 moves to the shift enable state and is latched in position to enable movement of gear shift lever 13 out of the park position. If for some reason solenoid 59 does not assume the lock inhibit state to inhibit ignition lock cylinder 31 from returning to OFF/LOCK, then SEC 29 will not be energized and gear shift lever 13 remains inhibited from movement out of the park position. Of course, in this scenario, ignition lock cylinder is free to rotate to OFF/LOCK whereat key 33 can be relinquished.

Assuming that ignition lock cylinder 31 is in the RUN position, plunger 55 is in the lock inhibit state, plunger 21 is in the shift enable state, then gear shift lever 13 is thereby enabled to move out of the park position and among the various other available positions. Ignition lock cylinder 31 is able to rotate to the ACC position unimpeded, however, it is inhibited from rotating beyond ACC to OFF/LOCK until certain conditions are met. Until gear shift lever 13 is properly returned to the park position and shifter button released, the current solenoid states will be maintained and the ignition lock cylinder is prevented from returning to the OFF/LOCK position thereby retaining the ignition key therein. When gear shift lever 13 is returned to the park position, shifter button released and the ignition lock cylinder is contemporaneously, even transiently, in the ACC position, then solenoid 19 is caused to change its state through energization of SIC 27. Plunger 21 moves to the shift inhibit state and is latched in position to inhibit movement of gear shift lever 13 out of the park position. With ignition lock cylinder 31 still in the ACC position, solenoid 59 is next caused to change its state through energization of LEC 61. Plunger 55 moves to the lock enable state and is latched in position to enable movement of ignition lock cylinder 31 to OFF/LOCK. If for some reason solenoid 19 does not assume the shift inhibit state to inhibit movement of gear shift lever 13 out of the park position, then LEC 61 will not be energized and ignition lock cylinder 31 remains inhibited from movement into OFF/LOCK. Of course, in this scenario, gear shift lever 13 remains free to move among the various available positions.

Override of the system in the event of an electrical failure or run-down of the vehicle battery is desirable. If it is necessary to tow the vehicle for example, it may be necessary to select a neutral gear position. Similarly, if it is necessary to move the vehicle manually then it is necessary to select a neutral gear position. It is possible to provide mechanical overrides for the present system, however, the preferred override is provided electrically without the expense of significant hardware. With the ignition lock cylinder in the ACC or RUN position, the LIC 57 and SEC 29 can be energized from an external DC power source via override terminal pair 70. Coupling the positive terminal of an external DC power source to the one terminal of override terminal pair coupled to line 47 and the negative terminal thereof to the other terminal of the override terminal pair coupled to lines 73 will energize the two solenoid coils via IGN2 closed contact, line 53, respective blocking diodes 54A and 54B and respective energization lines 72 and 75. Polarity reversal of the external DC power source will not effectuate any change in the solenoid states since the blocking diodes prevent current passage to either coil. Blocking diodes are illustrated as part of controller 80 discussed below.

Controller 80 is preferably a microcomputer based controller having internal CPU, RAM, ROM, clock and input/output (I/O) circuitry associated therewith for running a series of repetitive pre-programmed instructions stored in ROM for carrying out the monitoring and control functions of the present interlock system. I/O 99 is illustrated having a plurality of binary digital input ports I0–I3 and binary digital output ports O0-O6. High and low states correspond substantially to system voltage B+(labeled V+internal the controller) and ground references respectively. The states of contacts IGN0, IGN1 and park switch 15 are monitored by controller 80 at I0 and I1. I0 reads a low state any time park switch 15 is closed because the port will be coupled to ground reference via lines 65 and 67. With park switch 15 open and ignition lock cylinder 31 in OFF/LOCK, I0 will read a low state since lines 65 and 43 are floating and I0 is coupled to ground reference via pulldown resistor 91. However, with park switch 15 open and ignition lock cylinder 31 in ACC or RUN, I0 will read a high state since line 43 is now coupled to system voltage B+and I0 is coupled thereto via current limiting resistor 90A. I1 will read a high state with ignition lock cylinder in OFF/LOCK since I1 is coupled to B+via line 45 and current limiting resistor 90B. I1 will read a low state with ignition lock cylinder 31 in ACC or RUN since line 45 is now floating and I1 is coupled to ground reference via pulldown resistor 92.

The solenoid states are controlled by controller 80 at O1–O3, O5 and O6. The magnetically latching solenoids need only be pulse energized to actuate the plungers since thereafter assuming the commanded position the magnetic latching provides state stability. A controlled common ground path for energization of all solenoid coils comprises lines 73 and driver 98. Driver 98 includes a switching transistor and biasing resistor effective to couple lines 73 to ground upon output of a high state on line 97 from O3. O3 is normally at a low state and switches to a high state only when a solenoid is to be energized. All solenoids are energized independently and in the same fashion using respective energization lines 71, 72, 75 and 76 and corresponding drivers 88A, 9A, 88B and 89B. Taking solenoid 59 LEC 61 as an example, energization thereof is caused to occur by output port O3 outputting a high state to provide ground to LEC 61 and output port O1 switching from its normally high state to a low state. The low state outputted to line 95A causes driver 88A to couple system voltage B+to line 71 thereby energizing SEC 61 for so long as the zero state is maintained. Drivers 89A, 88B and 89B, output ports O2, O5 and O6 and lines 96A, 95B and 96B operate in the same fashion to energize LIC 57, SEC 29 and SIC 27 respectively.

In accordance with system operation whereby one solenoid will not assume an enable state until the other solenoid achieves an inhibit state, it becomes necessary to provide the controller with an indication that the respective inhibit state has been achieved. One manner of accomplishing this is via a respective state detection means such as a mechanical switch coupled and responsive to the respective lock-out means to thereby indicate the inhibit or enable state thereof. With the present invention, however, state detection is advantageously provided without additional mechanical hardware. Exemplary actuation detection circuits 81A and 81B are incorporated within controller 80 for detecting motion of plungers 55 and 21 respectively into the inhibit positions. In general, actuation detection circuits 81A & 81B are used to detect voltage induced in the respective LEC 61 and SEC 29 by plunger movement caused by energization of the respective LIC 57 and SIC 27. Plungers 55 and 21 carry magnetic flux from a permanent magnet in the solenoid assembly and the movement of the plunger is effective to induce a voltage in the respective coils of the solenoids.

Figure 4:
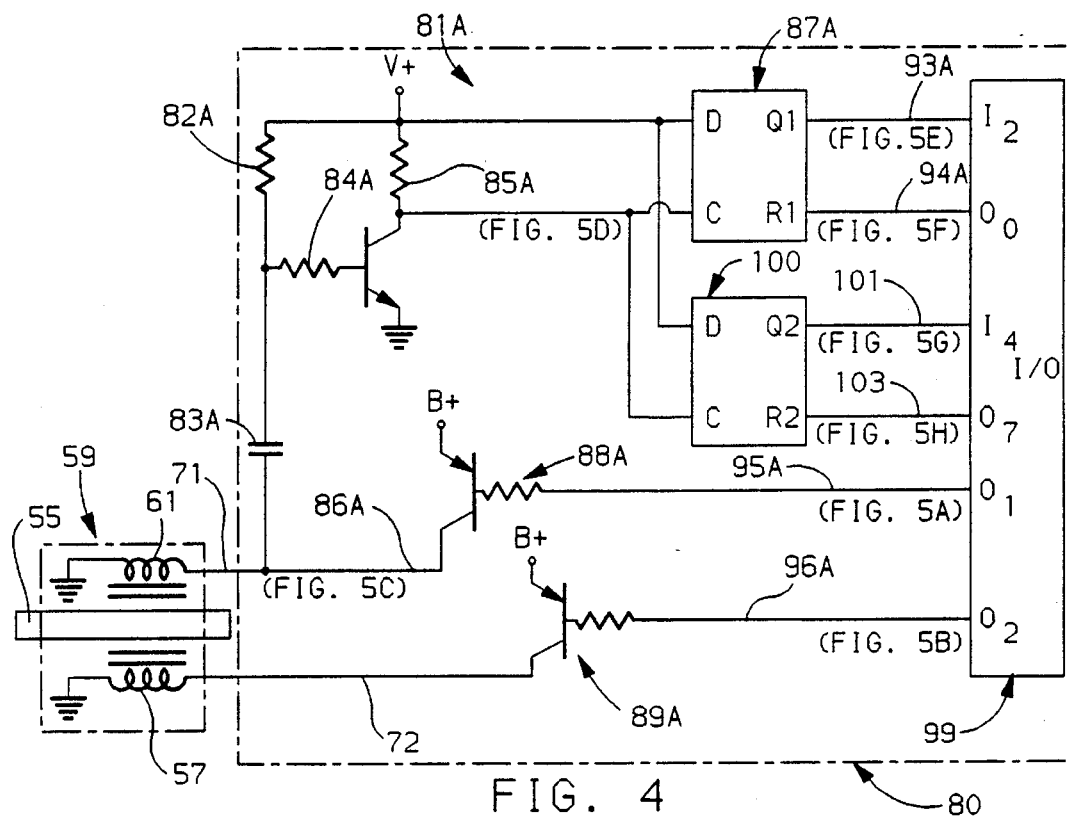
FIG. 4 illustrates an actuation detection circuit in accordance with a preferred embodiment of the apparatus of the present invention.

Referring now to FIG. 4, actuation detection circuit 81A is provided in detail apart from other details of FIG. 1. Circuit 81A is used to detect the motion of plunger 55 when it is commanded into the lock inhibit position through energization of LIC 57. Circuit 81A is exemplified herein with the understanding that circuit 81B functions in the same fashion as described but with respect to solenoid 19. Elements 82B–87B, 93B and 94B correspond respectively to elements 82A–87A, 93A and 94A as herein described. References to FIGS. 5A–5F below certain lines are made to illustrate operation of the exemplary actuation detection circuit. Additionally, flip-flop 100 is illustrated in FIG. 4 for diagnosing certain electrical faults in the energization circuitry. References to FIGS. 5G & 5H below lines 101 and 103 are made to illustrate operation of those lines in diagnosing electrical faults.

Figure 5A:
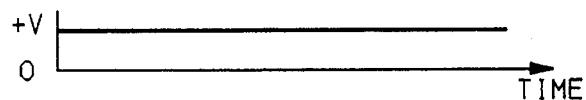
FIGS. 5A–5H illustrate control and response signals at various system circuit points of a portion of a preferred apparatus according to the present invention.
Figure 5B:
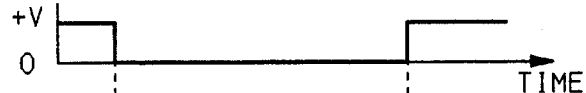
Figure 5C:
Figure 5D:
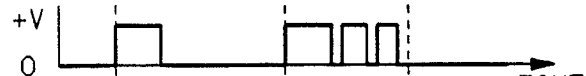
Figure 5E:
Figure 5F:
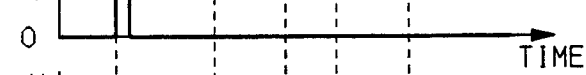
Figure 5G:
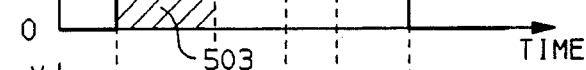
Figure 5H:

Referencing FIG. 4 and FIGS. 5A–5H and assuming an initial stable state prior to time t0 wherein plunger 55 is magnetically latched in the lock enable position, lines 95A and 96A are held high by output ports O1 and O2 as shown in FIGS. 5A and 5B respectively. Drivers 88A and 89A are therefore biased off and lines 71 and 72 are at ground reference. The clock lines (FIG. 5D) to flip-flops 87A and 100 are coupled to the collector of transistor 86A. Since steady state is assumed, transistor 86A is biased on via resistors 82A, 84A and 85A and DC blocking capacitor 83A thereby coupling the clock lines to clock input C of flip-flops 87A and 100 substantially to ground potential. The Q1 and Q2 outputs of flip-flops 87A and 100 on lines 93A and 101 to input ports I2 and I4 are assumed high and low respectively (FIGS. 5E and 5G). Lines 94A and 103 are held low by output ports O0 and O7 thereby providing ground reference to the reset inputs R1 and R2 of flip-flops 87A and 100 (FIGS. 5F and 5H).

At time t0, LIC 57 is energized by output port O2 holding line 96A low thereby switching driver 89A on and coupling line 72 to system voltage B+. The changing current therethrough LIC 57 induces a changing magnetic field which is coupled to LEC 61 and results in an induced voltage thereacross which is negative at line 71 with respect to the ground reference as illustrated in FIG. 5C. Transistor 86A is biased off since the common node between resistors 82A and 83A is AC coupled to the negative voltage on line 71 and clock input C is pulled up to a high logic level. Contemporaneously, output port O0 pulses line 94A and reset input R1 of flip-flop 87A high. Without the reset pulse, the rising edge of the voltage signal at the clock input C would cause the Q1 output to assume the high logic state then present at the D input of the flip-flop. The reset pulse effectively sets the output Q1 to a low state which will remain such until the next rising edge of a voltage signal at clock input C. Flip-flop 100 clock input C is also pulled up to a high logic level, however, no reset pulse is issued on line 103 (FIG. 5H) at output port O7 thereby resulting in the Q2 output assuming a high state. Eventually, as the current through LIC 57 stabilizes and reaches steady state, so too does the magnetic field coupled to LEC 61 and the induced voltage thereacross decays positively toward zero at line 71 with respect to the ground reference as illustrated in FIG. 5C. Transistor 86A will become biased on again thereby holding the clock line to ground reference.

Actuation detection circuit 81A is now ready to detect actuation of plunger 55 into the lock inhibit position. Plunger motion at time t2 causes a magnetic flux change through LEC 61 effective to induce a voltage thereacross which is negative at line 71 with respect to the ground reference as illustrated in FIG. 5C. Once again, transistor 86A is biased off and the clock line is pulled up to a high logic level, the rising edge of the voltage signal thereat latching the flip-flops at a high logic state. Between times t2 and t4, the voltage appearing at line 71 as illustrated in FIG. 5C can be seen to undergo several such induced voltage instances which cause corresponding clock pulses as illustrated in FIG. 5D. These are the effects of settling of the solenoid plunger similar to switch contact bounce in mechanical switches. They do not detrimentally effect the operation of the circuit since the clock pulses will merely latch in the current state at the D input of the flip-flop which is tied to high logic level voltage V+. Additionally, as can be seen at time t4, output port O2 reverts to its normally high state thereby causing a decay in the current through LIC 57 and the collapse of the magnetic field coupled to LEC 61. This induces a voltage thereacross which is positive at line 71 with respect to the ground reference as illustrated in FIG. 5C. This has no effect upon the positively biased transistor 86A and consequently does not cause any clock pulse at the flip-flop. Also at time t4, a reset pulse is output from output port O7 and causes the Q2 output of flip flop 100 to assume a low state.

Specifically with reference to FIGS. 5A–5H, the actual time associated with the various voltage signals are a function of the solenoid response characteristics and magnetic properties. In the present exemplary embodiment, the energization command for SIC 57 shown in FIG. 5B has a duration of approximately 25 ms from time t0 to t4, which time is sufficient for actuation of the solenoid plunger from the magnetically latched lock enable position to the magnetically latched lock inhibit position. Induced voltage across LEC 61 shown in FIG. 5C has transient responses and decays associated predominantly with the reactive solenoid coils and magnetic permeability of the plunger. The time t0-t2 which represents the time between initiating energization of LIC 57 and plunger motion can be expected to vary between different solenoid designs and among solenoids of the same design. One bi-stable magnetically latching solenoid design implemented in carrying out the present invention yielded such response time varying from about 5 ms to 15 ms. In the illustration of FIG. 5C, time t2 is shown to correspond substantially to 15 ms, the longest time expected for plunger actuation in a properly operating system.

The Q1 output of flip-flop 87A on line 93A input to input port I2 is the signal monitored for detecting actuation. Once the output has been reset to a low state at the beginning of the sequence as described, it will only transition to a high state if the clock input C of flip-flop 87A receives the rising edge of a voltage signal. This will only occur via motion of the plunger and absent plunger motion the clock pulses as characteristically illustrated between times t2 and t4 will not occur and output Q1 will remain low thus indicating failed actuation of the plunger. In the present exemplary embodiment, the state of the Q1 output is sampled in a diagnostic window between time t1 and t4 by the controller to establish its state as an indication of the actuation of the plunger. The diagnostic window is illustrated as hatched area 501 in FIG. 5E. Time t1 is chosen to correspond substantially with the earliest expected time of plunger motion and time t4 corresponds substantially to the end of the energization command at output port O2. Diagnostic window 501 can be further divided into two windows for diagnosing proper timing of solenoid plunger actuation. Detected actuation between time t1 (the earliest expected actuation) and time t2 (the latest time expected for plunger actuation in an optimally operating system) indicates actuation within acceptable time limitations. Detected actuation between time t2 and t4 (the end of solenoid energization) indicates actuation outside of acceptable time limitations which may indicate degrading performance of the solenoid, contamination, mechanical binding, etc.

The Q2 output of flip-flop 100 on line 101 input to input port I4 is the signal monitored for detecting electrical faults. Once the output has been reset to a low state at the end of a prior energization (FIG. 5H) as described, it will only transition to a high state if the clock input C of flip-flop 100 receives the rising edge of a voltage signal. This will first occur upon initiation of energization of LIC 57. Where energization does not occur or is not indicated by a negative voltage transient sa shown in FIG. 5C, the clock pulse as illustrated at time t0 will not occur and output Q2 will remain low thus indicating an electrical fault. In the present exemplary embodiment, the state of the Q2 output is sampled in a diagnostic window between time t0 and t1 by the controller to establish its state as an indication of an electrical fault. The diagnostic window is illustrated as hatched area 503 in FIG. 5E. If flip-flop 100 latches at all it will do so substantially contemporaneously with the commanded low state of output O2 (FIG. 5B). Therefore, the major consideration in choosing a boundary time t1 for the diagnostic window is to provide for adequate time to sample the output Q2.

An alternative to flip-flop 100 providing a latched input to I4 is to provide the clock line directly to input I4 thereby freeing up output port O7 and eliminating flip-flop 100. This alternative is viable where the reactive characteristics of the solenoid provides for a clock pulse of sufficient duration for adequate sampling of its state.

In the present system application of the invention, actuation of the plunger is detected in only one direction. However, similar actuation detection circuitry coupled to LEC 57 may be added, thereby providing bi-directional actuation detection.

Figure 6:
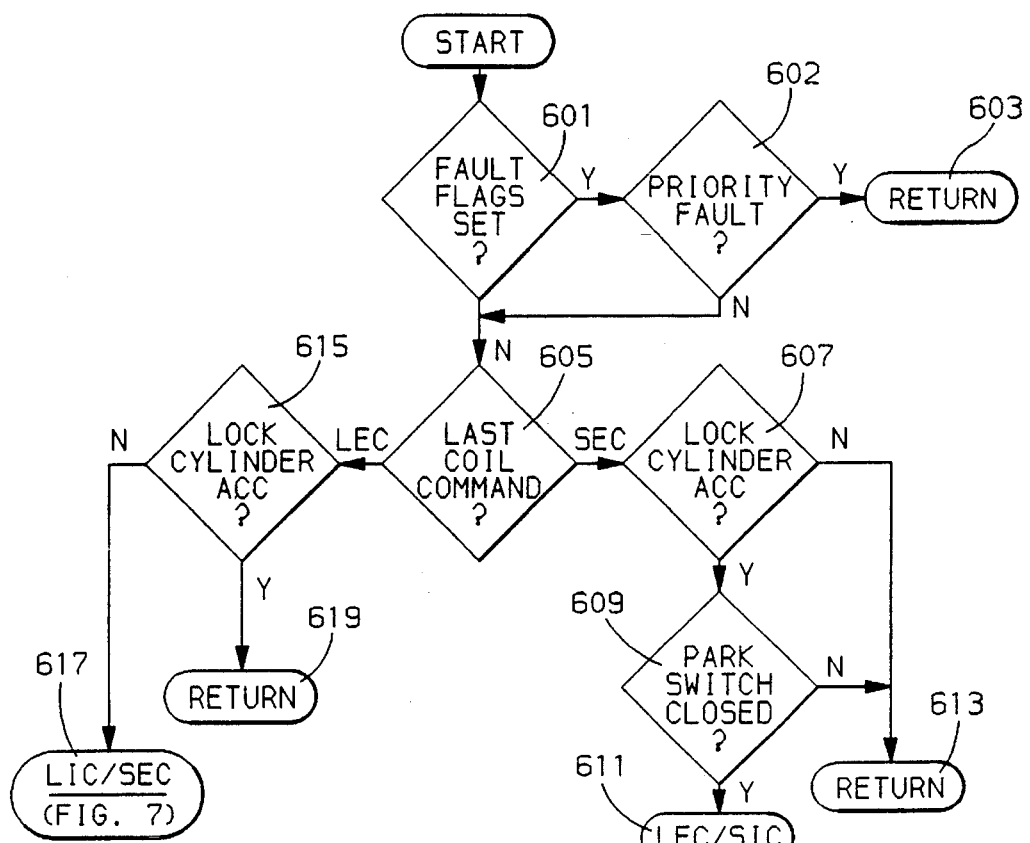
FIGS. 6–7 are algorithm steps representative of program instruction implemented in carrying out the interlock and diagnostic functions performed by the system of FIG. 1 via computer control.
Figure 7:
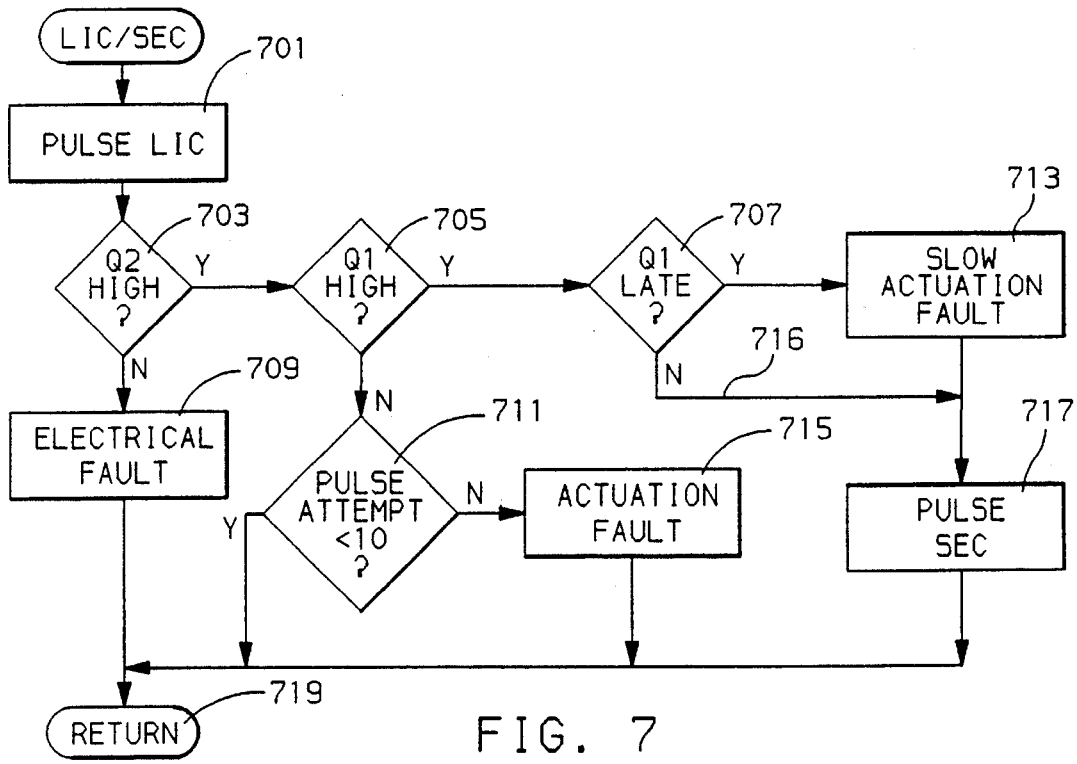

Referring now to FIGS. 6–7, a set of steps executable by the controller for carrying out the present invention are illustrated. The control steps are executed at regular intervals and may be part of a larger set of instructions executed for controlling other functions not related to the immediate ignition lock cylinder and gear shift lever interlock system. Preferably, a background program controls the execution of the control steps and performs various routine initialization, diagnostic, data acquisition and conditioning, and output functions. Such background programs are well known tho those skilled in the art and therefore are not illustrated herein.

Beginning with FIG. 6 and block 601, certain fault flags are preferably checked to determine if a system fault has been detected on a previous pass through the set of control instructions. If a fault detected, it is determined at block 602 whether the fault detected require suspension of further execution of the immediate control. In the present exemplary embodiment, priority faults are electrical faults and non-actuation of the solenoid. A non-priority fault is a slow actuation of the solenoid. Actual diagnosis of these faults will be discussed in conjunction with FIG. 7. Where a priority fault flag has been set, return to the background program is effectuated as shown by block 603. Where no fault flags have been set, control passes from block 601 to block 605 whereat a determination is made as to what state the interlock system is in. If the last coil command was energization of LEC 61, then block 615 is next executed. Alternatively, if the last coil command was energization of SEC 29, then block 607 is next executed.

Taking the situation where LEC 61 was last executed, it is known that SIC 27 successfully actuated plunger 21 to prevent movement of the shift lever out of the park position. The state of the ignition lock cylinder is checked at block 615 and if in ACC, the states of the solenoids are proper at lock enable and shift inhibit and the background program is returned via block 619. If it is determined at block 615 that the ignition lock cylinder is not in ACC, then it is assumed it is in RUN and the desired solenoid states are lock inhibit and shift enable. Therefore, block 617 is executed to energize LIC 57 and SEC 29.

Taking next the situation where, at block 605, it was determined that SEC 29 was last executed, it is known that LIC 57 successfully actuated plunger 55 to prevent movement of the ignition lock cylinder to OFF/LOCK. The state of the ignition lock cylinder is checked at block 607 and if not in ACC it is assumed it is in RUN and the states of the solenoids are proper at lock inhibit and shift enable, and the background program is returned via block 613. If it is determined at block 607 that the ignition lock cylinder is in ACC, then it is determined at block 609 if the shift lever is in the park position by checking the state of the park switch. If the park switch is not closed then the shift lever is known to be out of the park position or in the park position with the shifter button depressed. In either case the states of the solenoids are proper at lock inhibit and shift enable and the background program is returned via block 613. If at block 609 it is determined that the shift lever is properly in the park position with the shifter button not depressed, then the desired solenoid states are lock enable and shift inhibit since the ignition lock cylinder is also known to be in ACC. Therefore, block 611 is executed to energize LEC 61 and SEC 29.

Referring now to FIG. 7, exemplary steps for controlling the solenoid states to inhibit the ignition lock cylinder and enable the gear shift lever are illustrated. Diagnostic circuitry is assumed operational with the execution of these steps and the only faults of immediate concern are related to the electrical and mechanical actuation integrity of the solenoid. Reference to Q1 and Q2 states corresponds to the states as determined in the respective diagnostic windows. Block 701 commands the energization of LIC 57 and block 703 determines if the energization commanded resulted in an induced voltage on LEC 61. Where a voltage was induced and detected, output Q2 of flip-flop 100 is high and processing continues to block 705. Where no induced voltage is detected, Q2 is low and indicates an electrical fault. In this case, block 709 sets a priority fault flag and the background program is returned via block 719.

Block 705 is arrived at where Q2 has been diagnosed high indicating electrical integrity of the solenoid. Output Q1 of flip-flop 87A is checked at block 705 and if high actuation has occurred and processing passes to block 707. However, where Q1 is low, actuation has not occurred and processing passes to block 711 where it is determined if the actuation has been attempted less than ten (10) times. If the number of attempted actuations is less than ten, then block 711 returns to the background program and another attempted actuation will occur on the next pass through the control steps. If it is determined at block 711 that the attempted actuation was the tenth such attempt, then a priority fault flag is set at block 715 indicating failed actuation of plunger into the lock inhibit state and the background program returns via block 719.

Block 707 is arrived at where Q1 has been diagnosed high indicating actuation of the solenoid. If Q1 was first diagnosed high in the diagnostic window t1 to t2, solenoid actuation is normal and processing passes via line 716 to block 717. Where, however, Q1 was first diagnosed high in the diagnostic window t2 to t4, solenoid actuation is considered slow which may be indicative of degrading performance of the solenoid, contamination, mechanical binding, etc. Therefore, a non-priority flag is set a block 713 indicating less than optimal performance. In addition, block 707 may represent steps which determine if multiple pulse attempts before actuation as discussed with reference to block 711 have occurred. In which case, a slow actuation fault flag may properly be set at block 713 also. In any event, since actuation of plunger 55 into the lock inhibit state has been detected, block 717 will pulse SEC 29 to enable movement of the shift lever out of the park position.

Detailed steps for block 611 of FIG. 6 for performing similar solenoid pulsing and diagnosis on LEC 61 and SIC 27 are not given herein as they are similar in function to those discussed above with reference to FIG. 7. However, the steps for block 611 are performed to enable the ignition lock cylinder and inhibit the gear shift lever.

While the invention described herein has been set forth with relation to certain preferred and exemplary embodiments, it is understood that any number of variations may be apparent in implementing the invention, and that the scope of the invention is to be limited only to the scope of the appended claims and not by any limitations implied from the detailed description given herein.

The embodiments of the invention in which an exclusive property or privilege is claimed are defined as follows:

1. A method for diagnosing electrical integrity and mechanical integrity of a bi-stable magnetically latched solenoid, said solenoid comprising a pair of independently energizable coils, a plunger actuatable into one of two independent positions corresponding to the previously energized coil, a magnet providing flux through said plunger, said method comprising the steps:

energizing one of the coils;

monitoring a voltage across the other of the coils not energized;

determining from said monitored voltage the electrical integrity of the coils and mechanical actuation integrity of the plunger.

2. A method for diagnosing electrical integrity and mechanical integrity of a bi-stable magnetically latched solenoid as claimed in claim 1 wherein electrical integrity of said coils is determined by the presence of a transient voltage across the one of said coils not energized at a time substantially contemporaneous with an initiation of energization of the other of said coils.

3. A method for diagnosing electrical integrity and mechanical integrity of a bi-stable magnetically latched solenoid as claimed in claim 1 wherein mechanical actuation integrity of the plunger is determined by the presence of a transient voltage across the one of said coils not energized at a time subsequent to an initiation of energization of the other of said coils.

4. A method for diagnosing electrical integrity and mechanical integrity of a bi-stable magnetically latched solenoid as claimed in claim 1 wherein mechanical actuation integrity of the plunger is determined by the presence of a transient voltage across the one of said coils not energized prior to a predetermined time subsequent to an initiation of energization of the other of said coils.

5. An apparatus for diagnosing electrical integrity and mechanical integrity of a bi-stable magnetically latched solenoid, said solenoid comprising a pair of independently energizable coils, a plunger actuatable into one of two independent positions corresponding to the previously energized coil and a magnet providing flux through said plunger, said apparatus comprising:

means for detecting voltage transients across the one of said coils not energized;

means for distinguishing voltage transients due to an initiation of energization of the other of said coils from voltage transients due to actuation of said plunger, whereby absence of a detected voltage transient due to an initiation of energization of the other of said coils indicates an electrical fault and a detected voltage transient due to actuation of said plunger indicates actuation of the plunger.

6. An apparatus for diagnosing electrical integrity and mechanical actuation integrity of a bi-stable magnetically latched solenoid as claimed in claim 5 further comprising:

means for determining when a detected voltage transients due to actuation of said plunger indicates a slow actuation of said plunger.

* * * * *